(12) United States Patent
Lee et al.

(10) Patent No.: US 7,876,632 B2
(45) Date of Patent: Jan. 25, 2011

(54) SEMICONDUCTOR MEMORY DEVICE AND METHOD FOR REPAIRING THE SAME

(75) Inventors: Bong-Yong Lee, Suwon-si (KR);
Heon-Kyu Lee, Suwon-si (KR);
Kwang-Soo Kim, Jeonju-si (KR);
Sang-Youl Kwon, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 94 days.

(21) Appl. No.: 12/000,208

(22) Filed: Dec. 11, 2007

(65) Prior Publication Data

US 2008/0137454 A1 Jun. 12, 2008

(30) Foreign Application Priority Data

Dec. 11, 2006 (KR) ........................ 10-2006-0125735

(51) Int. Cl.
*G11C 7/00* (2006.01)
(52) U.S. Cl. .................. 365/200; 365/201; 365/230.03; 365/51
(58) Field of Classification Search ................ 396/200, 396/201, 230.03, 51, 63, 210.1
See application file for complete search history.

(56) References Cited

U.S. PATENT DOCUMENTS 6,101,138 A * 8/2000 Shiah et al. .................. 365/200

6,678,195 B2 * 1/2004 Hidaka ........................ 365/200

FOREIGN PATENT DOCUMENTS

| KR | 10-1998-0034820 | 8/1998 |
|---|---|---|
| KR | 1999-001473 | 1/1999 |
| KR | 10-0195677 | 2/1999 |
| KR | 10-2000-0059830 | 5/2000 |
| KR | 10-2005-0014765 | 7/2005 |
| KR | 1020050073100 A | 7/2005 |
| KR | 1020060005608 A | 1/2006 |

OTHER PUBLICATIONS

Foreign Action.

* cited by examiner

*Primary Examiner*—David Lam
(74) *Attorney, Agent, or Firm*—Harness, Dickey & Pierce, P.L.C.

(57) ABSTRACT

A semiconductor memory device includes a main cell array region, a first redundancy cell array region and a first dummy cell array region that are formed at one side of the main cell array region, and a second redundancy cell array region and a second dummy cell array region that are formed at the other side of the main cell array region. The first redundancy cell array region includes a first redundancy bitline, and the first dummy cell array region includes first dummy bitlines. The second redundancy cell array region includes a second redundancy bitline, and the second dummy cell array region includes second dummy bitlines. The first and second redundancy cell array regions are disposed closer to the main cell array region than the first and second dummy cell array regions.

12 Claims, 4 Drawing Sheets

SEMICONDUCTOR MEMORY DEVICE AND METHOD FOR REPAIRING THE SAME

PRIORITY STATEMENT

This U.S. non-provisional patent application claims priority under 35 U.S.C §119 of Korean Patent Application 2006-125735 filed on Dec. 11, 2006, the entirety of which is hereby incorporated by reference.

BACKGROUND

Example embodiments relate to semiconductor devices and, more particularly, to semiconductor devices and methods for repairing the same.

Generally, semiconductor memory devices are classified into volatile memory devices and non-volatile memory devices. Volatile memory devices lose their stored data when their power supplies are interrupted, while non-volatile memory devices retain their stored data even when their power supplies are interrupted.

Flash memory devices are non-volatile memory devices and may be classified into NOR-type flash memory devices (hereinafter referred to as "NOR flash memories") and NAND-type flash memory devices (hereinafter referred to as "NAND flash memories"). A NAND flash memory is configured to control a string of memory cells at the same time, while a NOR flash memory is configured to control memory cells independently.

A typical NOR flash memory includes a cell array region, which may include a main cell array region and a redundancy cell array region formed at one side or both sides of the main cell array region. The main cell array region includes global bitlines and local bitlines that are connected to the global bitlines. The redundancy cell array region includes redundancy bitlines and local redundancy bitlines that are connected to the redundancy bitlines.

The memory cell array region may include a number of memory cells disposed in a matrix of wordlines and local bitlines. Even if only one of the memory cells is defective, a NOR flash memory is generally not capable of performing operations. As integration density of semiconductor devices increases, the likelihood that a memory cell of a NOR flash memory is defective increases. A defective memory cell (hereinafter referred to as "fail cell") is a major cause of yield reduction in a NOR flash memory. Thus, if a fail cell is generated in a NOR flash memory, a bitline connected to the fail cell must be replaced with a redundancy bitline to compensate for a defect. For example, if an address is provided to select a fail cell, a redundancy bitline connected to a redundancy cell may be replaced with a global bitline connected to the fail cell to enable a NOR flash memory to operate normally.

That is, if a fail cell is generated in the main cell array region, a global bitline electrically connected to the fail cell is replaced with the redundancy bitline to be repaired. For this reason, repair technology for replacing a bitline connected to a fail cell with a redundancy bitline connected to a redundancy cell is important.

SUMMARY

Example embodiments provide a semiconductor memory device and a method for repairing semiconductor devices.

An example embodiment provides a semiconductor memory device. The semiconductor memory device may include: a main cell array region including main bitlines; a first redundancy cell array region including a first redundancy bitline and a first dummy cell array region including first dummy bitlines, the first redundancy cell array region and the first dummy cell array region being formed at one side of the main cell array region; and a second redundancy cell array region including a second redundancy bitline and a second dummy cell array region including second dummy bitlines, the second redundancy cell array region and the second dummy cell array region being formed at the other side of the main cell array region. The first and second redundancy cell array regions are disposed closer to the main cell array region than the first and second dummy cell array regions.

Another example embodiment provides a method for repairing a semiconductor memory device. The method may include determining whether there is a fail cell in the main cell array region of the semiconductor memory device; selecting a redundancy bitline of one of the redundancy cell array regions to replace a main bitline electrically connected to a determined fail cell, the selecting being based on proximity of the redundancy cell array regions to the main cell array region of the semiconductor memory device; and replacing the main bitline electrically connected to the determined fail cell with the selected redundancy bitline. For example, the selecting selects the redundancy bitline from an available redundancy cell array region in closest proximity to the main cell array region.

BRIEF DESCRIPTION OF THE DRAWINGS

The above and other features, aspects and advantages of example embodiments will become more apparent from a review of the detailed description, which refers to the attached drawings in which.

DETAILED DESCRIPTION OF EXAMPLE EMBODIMENTS

Figure 1:
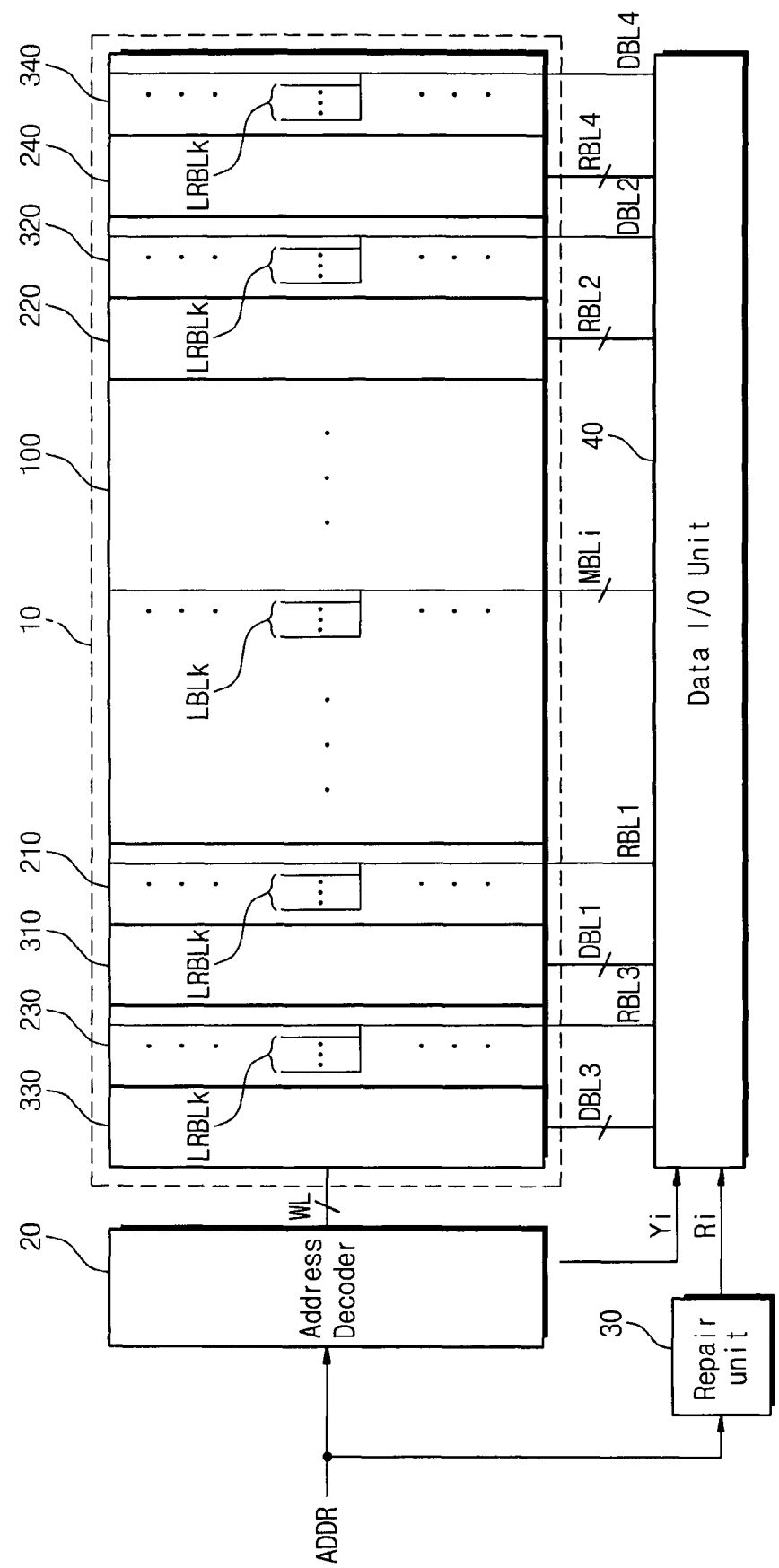
FIG. 1 is a block diagram illustrating an example embodiment of a semiconductor memory device.

Various example embodiments will now be described more fully with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the embodiments set forth herein.

It should be understood that, although the terms first, second, etc. are used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments described below with respect to the drawings are provided so that this disclosure will be thorough, complete and fully convey the concept of example embodiments to those skilled in the art. In the drawings, like numbers refer to like elements throughout. Further, the thicknesses of layers and regions are exaggerated for clarity in the drawings.

An example embodiment of a semiconductor memory device is illustrated in FIG. 1. The semiconductor memory device may be a NOR flash memory, for example. The semiconductor memory device illustrated in FIG. 1 includes a cell array region 10, an address decoder 20, a repair unit 30, and a data input/output unit (hereinafter referred to as "data I/O unit") 40.

The cell array region 10 may include a main cell array region, redundancy cell array regions and dummy cell regions. Referring to FIG. 1, the cell array region 10 includes a main cell array region 100, redundancy cell array regions 210, 220, 230, and 240 and dummy cell array regions 310, 320, 330, and 340. The redundancy cell array regions 210, 220, 230 and 240, and the dummy cell array regions 310, 320, 330, and 340, are arranged at both sides of the main cell array region 100. Redundancy cell array regions may include first and third redundancy cell array regions 210 and 230 formed at one side of the main cell array region 100 and second and fourth redundancy cell array regions 220 and 240 formed at the other side of the main cell array region 100. Dummy cell array regions may include first and third dummy cell array regions 310 and 330 formed at one side of the main cell array region 100 and second and fourth dummy cell array regions 320 and 340 formed at the other side of the main cell array region 100.

At the one side of the main cell array region 100, the first redundancy cell array region 210, the first dummy cell array region 310, the third redundancy cell array region 230, and the third dummy cell array region 330 are sequentially disposed from the main cell array region 100. At the other side of the main cell array region 100, the second redundancy cell array region 220, the second dummy cell array region 320, the fourth redundancy cell array region 240, and the fourth dummy cell array region 340 are sequentially disposed from the main cell array region 100. That is, the first and second redundancy cell array regions 210 and 220 are disposed closer to the main cell array region 100, than the other regions of the cell array region 10. Stated differently, the first and second redundancy cell array regions 210 and 220 are interposed between the main cell array region 100 and the other regions of the cell array region 10, such as the third and fourth redundancy cell array regions 230 and 240 and the dummy cell array regions 310 320, 330, and 340. For example, the first and second redundancy cell array regions 210 and 220 may be formed directly adjacent to the main cell array region 100.

Still referring to FIG. 1, the main cell array region 100 includes main bitlines MBLi and local bitlines LBLk. The local bitlines LBLk are connected to the main bitlines MBLi.

The redundancy cell array regions 210, 220, 230, and 240 include redundancy bitlines RBL1, RBL2, RBL3, and RBL4. For example, the first redundancy cell array region 210 may include a first redundancy bitline RBL1; the second redundancy cell array region 220 may include a second redundancy bitline RBL2; the third redundancy cell array region 230 may include a third redundancy bitline RBL3; and the fourth redundancy cell array region 240 may include a fourth redundancy bitline RBL4. Also, the redundancy cell array regions 210, 220, 230, and 240 may include local redundancy bitlines LRBLk that are respectively connected to the redundancy bitlines RBL1, RBL2, RBL3, and RBL4. The number of the local redundancy bitlines LRBLk is equal to that of the local bitlines LBLk.

The dummy cell array regions 310, 320, 330, and 340 include dummy bitlines DBL1, DBL2, DBL3, and DBL4. For example, the first dummy cell array region 310 may include a first dummy bitline DBL1; the second dummy cell array region 320 may include a second dummy bitline DBL2; the third dummy cell array region 330 may include a third dummy bitline DBL3; and the fourth dummy cell array region 340 may include a fourth dummy bitline DBL4. The number of third dummy bitlines DBL3 may be larger than that of first dummy bitlines DBL1, and the number of fourth dummy bitlines DBL4 may be larger than that of second dummy bitlines DBL2 according to an example embodiment.

The address decoder 20 may include a row decoder (not shown) and a column decoder (not shown). When an external address ADDR including a row address X-Addr and a column address Y-Addr is provided to the address decoder 20, the row decoder selects one wordline WL in response to the row address X-Addr and the column decoder provides a select signal Yi for selecting main bitlines to the data I/O unit 40 in response to the column address Y-Addr.

The repair unit 30 may include a fuse box (not shown) in which repair addresses are stored. If a fail cell is generated and/or detected at the main cell array region 100, a repair address corresponding to a column address of the fail cell is stored in the fuse box. For example, the storage of a repair address may be conducted by cutting or connecting a fuse of the fuse box. When a column address Y-Addr is provided to the repair unit 30, the repair unit 30 determines whether the column address Y-Addr is identical to a repair address stored in the fuse box. If the column address Y-Addr is identical to the repair address, the repair unit 30 provides a repair signal Ri for selecting redundancy bitlines to the data I/O unit 40 in response to the column address Y-Addr.

The data I/O unit 40 connects an input/output line (not shown) to the main bitlines MBLi or the redundancy bitlines RBL1, RBL2, RBL3, and RBL4. The data I/O unit 40 connects the input/output line to the main bitlines MBLi in response to the select signal Yi received from the address decoder 20 and connects the input/output line to the redundancy bitlines RBL1, RBL2, RBL3, and RBL4 in response to the repair signal Ri received from the repair unit 30.

Figure 2:
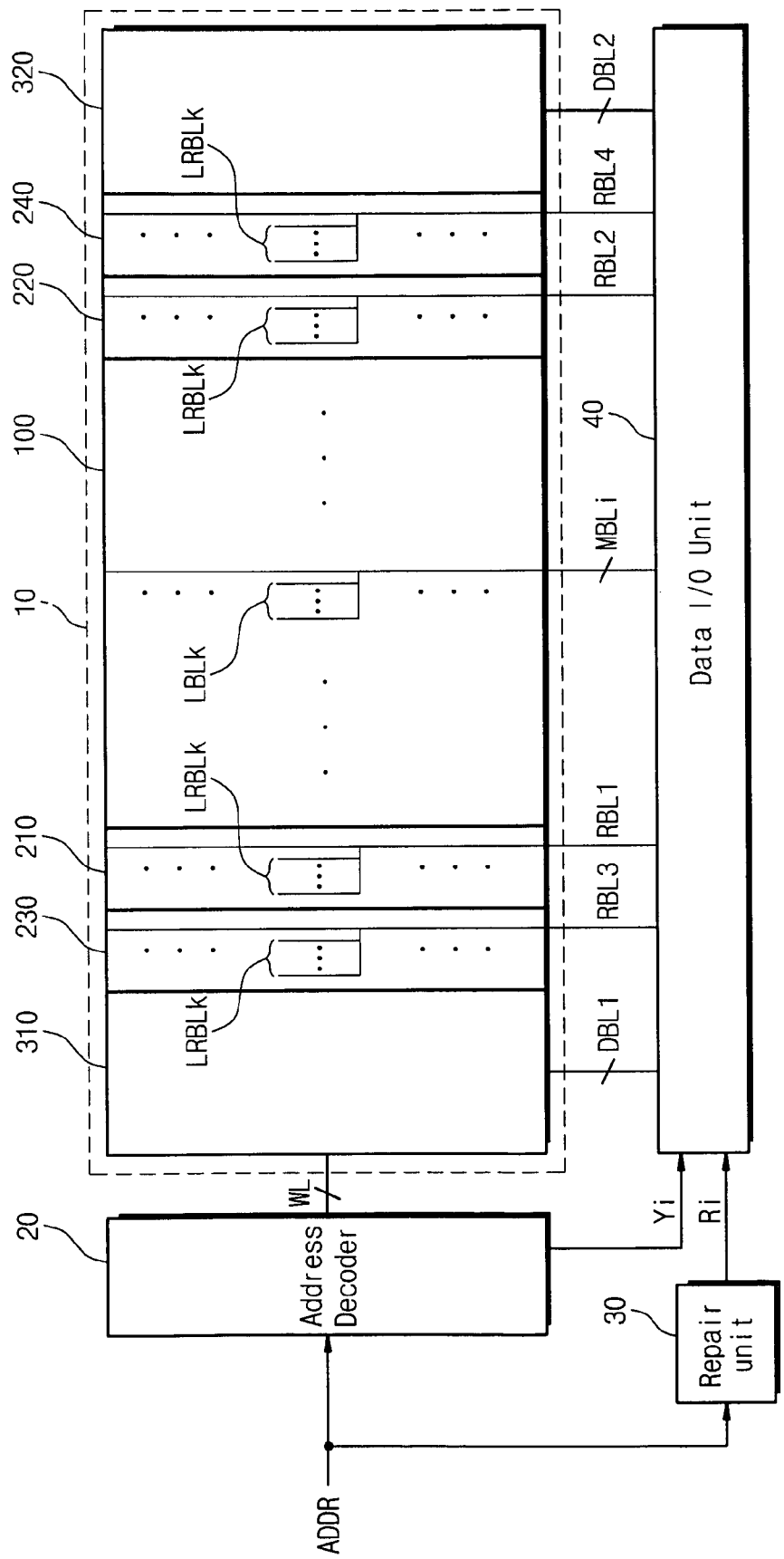
FIG. 2 is a block diagram illustrating another example embodiment of a semiconductor memory device.

Another example embodiment of a semiconductor memory device is illustrated in FIG. 2. In this embodiment, duplicate parts previously described with respect to the example embodiment described in FIG. 1 will be omitted for the sake of brevity. That is, the description of the example embodiment illustrated in FIG. 2 primarily focuses on differences between the example embodiments of FIGS. 1 and 2 and components or parts of the example embodiment of FIG. 2 that differ from the example embodiment of FIG. 1.

Referring to FIG. 2, a main cell array region 100, redundancy cell array regions 210, 220, 230, and 240, and dummy cell array regions 310 and 320 constituting the cell array region 10 are arranged differently than those of the example embodiment described with reference to FIG. 1.

The cell array region 10 may include a main cell array region 100 and redundancy cell array regions 210, 220, 230, and 240 and dummy cell array regions 310 and 320 formed at both sides of the main cell array region 100. Redundancy cell array regions may include first and third redundancy cell array regions 210 and 230 disposed at one side of the main cell array region 100 and second and fourth redundancy cell array regions 220 and 240 disposed at the other side of the main cell array region 100. Dummy cell array regions may include a first dummy cell array region 310 disposed at one side of the main cell array region 100 and second dummy cell array regions 320 and 340 disposed at the other side of the main cell array region 100.

At the one side of the main cell array region 100, a first redundancy cell array region 210, a third redundancy cell array region 230, and a first dummy cell array region 310 are sequentially disposed from the main cell array region 100. At the other side of the main cell array region 100, a second redundancy cell array region 220, a fourth redundancy cell array region 240, and a second dummy cell array region 320 are sequentially disposed from the main cell array region 100.

Unlike the embodiment described with reference to FIG. 1, a dummy cell array region is not disposed between the first redundancy cell array region 210 and the third redundancy cell array region 230 and between the second redundancy cell array region 220 and the fourth redundancy cell array region 240. However, the first and second redundancy cell array regions 210 and 220 are disposed to be closest to the main cell array region 100, which is identical to the embodiment described with reference to FIG. 1.

Figure 3:
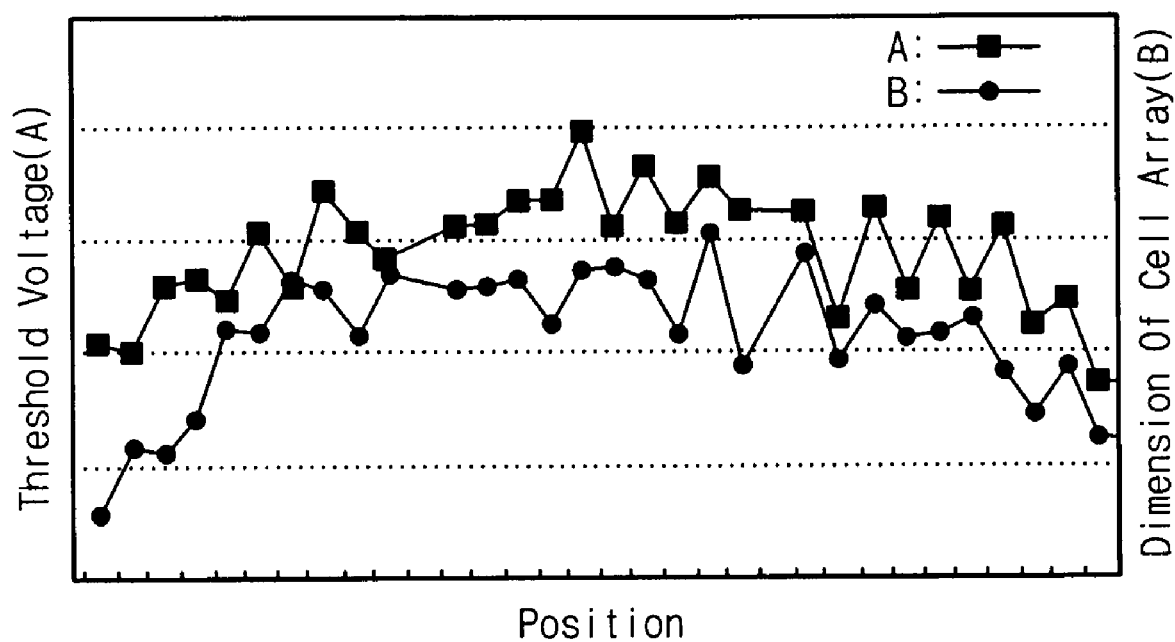
FIG. 3 illustrates cell operation characteristic based on positions of a semiconductor memory device.

Cell operation characteristic based on positions of a semiconductor memory device will now be described with reference to FIGS. 1 and 3. In FIG. 3, a horizontal axis denotes positions in a cell array region 10 and a vertical axis denotes relative sizes of respective threshold voltages and dimension of cell array at the positions. The dimension of cell array means a size of linewidth of a gate electrode in a cell array. A graph "A" represents threshold voltage, and a graph "B" represents dimension of cell array.

As illustrated in FIGS. 1 and 3, threshold voltage and dimension of cell array are relatively uniform at the center of a cell array region 10 and decrease toward both edges of the cell array region 10. Namely, an operation characteristic of a cell adjacent to a main cell array region is superior to that of a cell further away from the main cell array region. This is, at least in part, because a difference between cell densities at the center and edge of the cell array region has an effect on manufacturing processes such as a photolithography process, an etching process, and a planarizing process. Although it is important to develop novel process technologies for overcoming the above problem, the development of novel process technologies incurs considerable costs and there is a limit to the development thereof.

Accordingly, example embodiments accommodate for the operation characteristic of a semiconductor memory device shown in FIG. 3. Returning to FIGS. 1 and 2, as described above, an operation characteristic of a cell adjacent to the main cell array region 100 is superior. Therefore, the first and second redundancy cell array regions 210 and 220 are disposed closer to the main cell array region 100 than the first and second dummy cell array regions 310 and 320 according to an example embodiment. Since the first and second redundancy cell array regions 210 and 220 are closer to the main cell array region 100 than the third and fourth redundancy cell array regions 230 and 240, operation characteristic of a cell disposed in the first and second cell array regions 210 and 220 is superior to that of a cell disposed in the third and fourth cell array regions 230 and 240. For this reason, in order to repair a fail cell generated at the main cell array region 100, a main bitline MBL connected to the fail cell is replaced with a redundancy bitline RBL disposed closer to the main cell array region 100. Dummy cell regions (the third and fourth dummy cell regions 330 and 340 in FIG. 1, and the first and second dummy cell regions 310 and 320 in FIG. 2) are disposed at both edges of the cell array region 10. Accordingly, since cells having relatively poor operation characteristic as shown in FIG. 3 are disposed at the dummy cell array region, cells having superior operation characteristic may be disposed at the redundancy cell array regions 210, 220, 230, and 240 according to an example embodiment.

An example embodiment of a method of repairing the semiconductor memory device shown in FIG. 1 will now be described with reference to FIGS. 1 and 4. In this embodiment, described will be the case where two fail cells having different column addresses are detected and/or generated at a main cell region. Although not shown in FIG. 1, the two fail cells will be denoted as a first fail cell and a second fail cell, a main bitline connected to the first fail cell will be denoted as a first main bitline, and a main bitline connected to the second fail cell will be denoted as a second main bitline.

Figure 4:
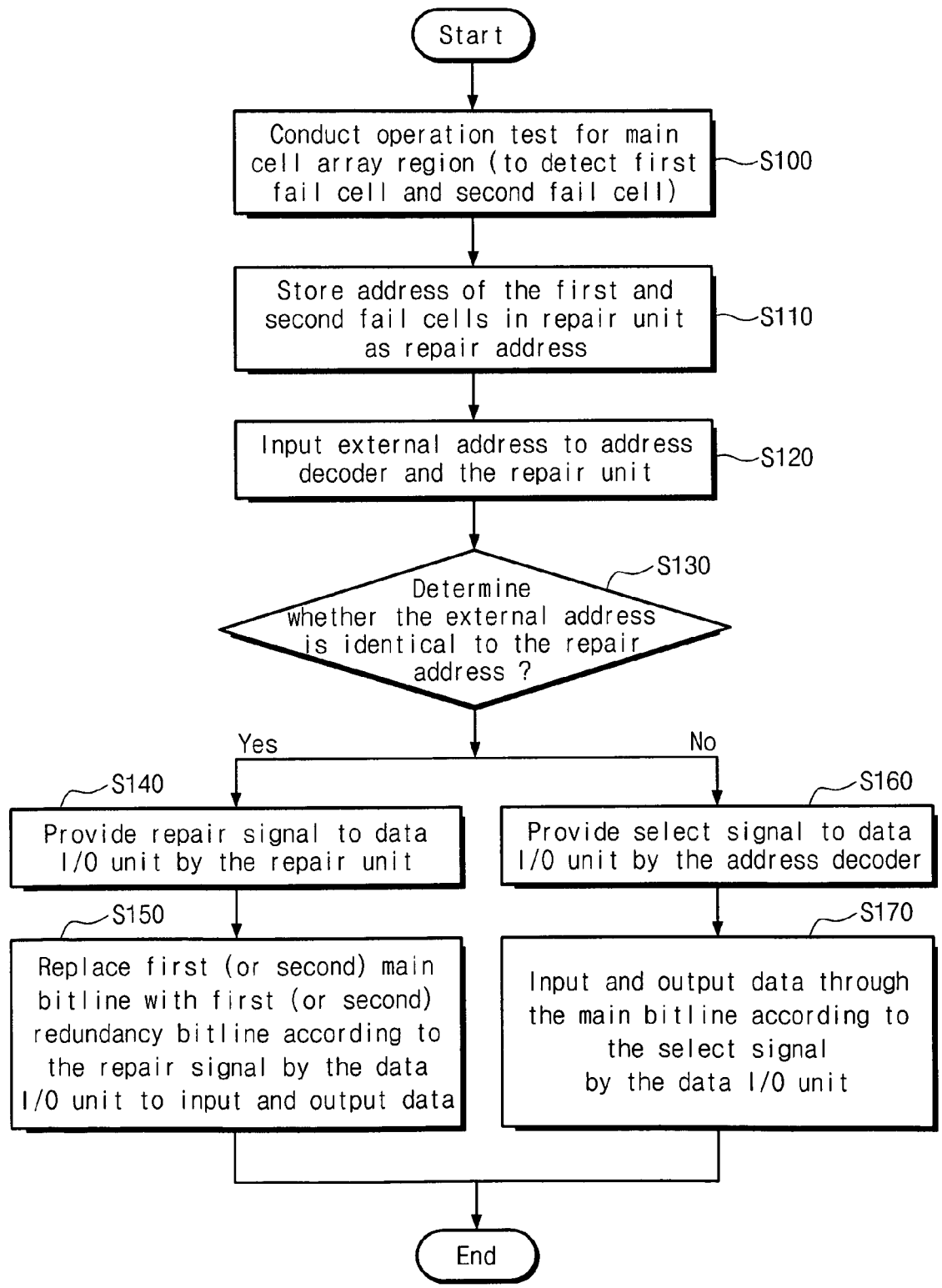
FIG. 4 is a flowchart illustrating an example embodiment of a method for repairing the semiconductor memory device shown in FIG. 1.

Referring to FIGS. 1 and 4, an operation test is conducted (S100) for cells disposed at a main cell array region 100. The operation test may be conducted by programming the cells and reading the programmed cells, for example. The operation test is conducted to detect a first fail cell and a second fail cell. A first repair address corresponding to a column address of the first fail cell and a second repair address corresponding to a column address of the second fail cell are stored in a repair unit 30 (110).

An external address ADDR is input to an address decoder 20 and the repair unit 30 (S120). The external address ADDR includes a row address X-Addr and a column address Y-Addr. The row address X-Addr and the column address Y-Addr are input to the address decoder 20, and the column address Y-Addr is input to the repair unit 30. The repair unit 30 determines whether the input column address Y-Addr is identical to a stored repair address (S130).

If the column address Y-Addr is identical to the first repair address, the repair unit 30 provides a first repair signal Ri to a data I/O unit 40 (S140). The data I/O unit 40 replaces a first main bitline MBL1 with a first redundancy bitline adjacent to a main cell array region 10 in response to a first repair signal Ri to input and output data (S150). For example, a redundancy bitline of one of the redundancy cell array regions is selected to replace a main bitline based on proximity of the redundancy cell array regions to the main cell array region 100 of the semiconductor memory device.

Similarly, if the column address Y-Addr is identical to the second repair address, the repair unit 30 provides a second repair signal Ri to the data I/O unit 40 (S140). The data I/O unit 40 replaces a second main bitline MBL2 with a second redundancy bitline adjacent to the main cell array region 100 in response to the second repair signal Ri to input and output data (S150). Again, a redundancy bitline of one of the redundancy cell array regions is selected to replace a main bitline based on proximity of the redundancy cell array regions to the main cell array region 100 of the semiconductor memory device.

If the column address Y-Addr is not identical to the first and second repair addresses, the address decoder 30 provides a select signal Yi to the data I/O unit 40 (S160). The data I/O unit 40 inputs and outputs data through a main bitline that the select signal Yi assigns (S170).

In summary, according to example embodiments, cells having superior operation characteristic are disposed in a redundancy cell array region. Thus, although a fail cell is generated and/or detected, the affect of the fail cell is suppressed to improve the yield of semiconductor memory devices according to an example embodiment. Moreover, a redundancy bitline including cell having superior operation characteristic is first used to repair a fail cell. Therefore, according to example embodiments, it is possible to address and/or repair problems that may arise from manufacturing processes.

Although example embodiments illustrated in FIGS. 1-4 have been described in connection, one skilled in the art will appreciate this disclosure is not limited thereto. It will be apparent to those skilled in the art that various substitutions, modifications and changes may be made to the example embodiments without departing from the scope and spirit of this disclosure.

What is claimed is:

1. A semiconductor memory device comprising:
   a main cell array region including main bitlines;
   a first redundancy cell array region including a first redundancy bitline and a first dummy cell array region including first dummy bitlines, the first redundancy cell array region and the first dummy cell array region being formed at one side of the main cell array region; and
   a second redundancy cell array region including a second redundancy bitline and a second dummy cell array region including second dummy bitlines, the second redundancy cell array region and the second dummy cell array region being formed at the other side of the main cell array region,
   wherein the first and second redundancy cell array regions are disposed closer to the main cell array region than the first and second dummy cell array regions.

2. The semiconductor memory device of claim 1, further comprising:
   a third redundancy cell array region including a third redundancy bitline and a third dummy cell array region including third dummy bitlines, the third redundancy cell array region and the third dummy cell array region being formed at the one side of the main cell array region; and
   a fourth redundancy cell array region including a fourth redundancy bitline and a fourth dummy cell array region including fourth dummy bitlines, the fourth redundancy cell array region and the fourth dummy cell array region being formed at the other side of the main cell array region,
   wherein the third and fourth redundancy cell array regions are disposed closer to the main cell array region than the third and fourth dummy cell array regions.

3. The semiconductor memory device of claim 2, wherein the first redundancy cell array region is disposed closer to the main cell array region than the third redundancy cell array region; and
   the second redundancy cell array region is disposed closer to the main cell array region than the fourth redundancy cell array region.

4. The semiconductor memory device of claim 3, wherein the first dummy cell array region is disposed closer to the main cell array region than the third redundancy cell array region; and
   the second dummy cell array region is disposed closer to the main cell array region than the fourth redundancy cell array region.

5. The semiconductor memory device of claim 4, wherein the number of the third dummy bitlines is larger than the number of the first dummy bitlines, and the number of the fourth dummy bitlines is larger than the number of the second dummy bitlines.

6. The semiconductor memory device of claim 2, wherein the main cell array region includes local bitlines that are respectively connected to the main bitlines; and
   the first to fourth redundancy cell array regions include local redundancy bitlines that are respectively connected to the first to fourth redundancy bitlines.

7. The semiconductor memory device of claim 1, further comprising:
   a third redundancy cell array region including a third redundancy bitline, the third redundancy cell array region being formed between the first redundancy cell array region and the first dummy cell array region; and
   a fourth redundancy cell array region including a fourth redundancy bitline, the fourth redundancy cell array region being formed between the second redundancy cell array region and the second dummy cell array region.

8. The semiconductor memory device of claim 1, wherein the first redundancy cell array region and the second redundancy cell array region are directly adjacent to the main cell array region.

9. A method for repairing a semiconductor memory device including a main cell array region and a plurality of redundancy cell array regions, the method comprising:
   determining whether there is a fail cell in the main cell array region of the semiconductor memory device;
   selecting a redundancy bitline of one of the redundancy cell array regions to replace a main bitline electrically connected to a determined fail cell, the selecting being based on proximity of the redundancy cell array regions to the main cell array region of the semiconductor memory device; and
   replacing the main bitline electrically connected to the determined fail cell with the selected redundancy bitline, wherein
   the plurality of redundancy cell array regions include
      a first redundancy cell array region having a first redundancy bitline and a third redundancy cell array region having a third redundancy bitline, the first redundancy cell array region and the third redundancy cell array region being formed one side of the main cell array region, and
      a second redundancy cell array region having a second redundancy bitline and a fourth redundancy cell array region havinj a fourth redundancy bitline, the second redundancy cell array region and the fourth redundancy cell array region being formed at the other side of the main cell array region, and the first and second redundancy cell array regions are disposed to be closer to the main cell array region than the third and fourth redundancy cell array regions.

10. The method of claim 9, wherein the selecting selects the redundancy bitline from an available redundancy cell array region in closest proximity to the main cell array region.

11. The method of claim 9, further comprising:
a first dummy cell array region including first dummy bitlines disposed between the first redundancy cell array region and the third redundancy cell array region; and
a second dummy cell array region including second dummy bitlines disposed between the second redundancy cell array region and the fourth redundancy cell array region.

12. The method of claim 9, wherein,
a distance between the first redundancy bitline and the main cell array region is equal to a distance between the second redundancy bitline and the main cell array region, and a distance between the third redundancy bitline and the main cell array region is equal to a distance between the fourth redundancy bitline and the main cell array region; and the replacing the main bitline electrically connected to the determined fail cell with the selected redundancy bitline includes selecting a redundancy bitline to replace the main bitline in the order of the first redundancy bitline, the second redundancy bitline, the third redundancy bitline, and the fourth redundancy bitline.

* * * * *